(12) United States Patent
Lang et al.

(10) Patent No.: US 7,296,250 B2
(45) Date of Patent: Nov. 13, 2007

(54) METHOD AND SYSTEM FOR CHARACTERIZING ELECTRONIC CIRCUITRY

(75) Inventors: Alfred Lang, Weilheim (DE); Stefan Bergler, Munich (DE)

(73) Assignee: Infineon Technologies AG, Munich (DE)

( * ) Notice: Subject to any disclaimer, the term of this patent is extended or adjusted under 35 U.S.C. 154(b) by 349 days.

(21) Appl. No.: 11/000,140

(22) Filed: Nov. 30, 2004

(65) Prior Publication Data

US 2005/0131661 A1 Jun. 16, 2005

(30) Foreign Application Priority Data

Dec. 1, 2003 (EP) ................................. 03027574

(51) Int. Cl.
*G06F 17/50* (2006.01)
(52) U.S. Cl. ............................................. 716/4; 716/5
(58) Field of Classification Search ................. 716/1–5
See application file for complete search history.

(56) References Cited

U.S. PATENT DOCUMENTS

| 6,272,664 | B1 | 8/2001 | Chang et al. | |
|---|---|---|---|---|
| 7,051,293 | B1 * | 5/2006 | Teig et al. ..................... | 716/1 |
| 2006/0015831 | A1 * | 1/2006 | Varshney et al. .............. | 716/4 |

FOREIGN PATENT DOCUMENTS

JP 05012325 1/1993

OTHER PUBLICATIONS

Hiramasa Suzuki and Shingo Takeuchi; Subdivision Surface Fitting to a Range of Points; The University of Tokyo Department of Precision Engineering; Aug. 1999; pp. 158-167; Tokyo, Japan.
Brian Konesky; AutoDevSurf; http:/www.interchange.ubc.ca/konesky/newpage2.htm; pp. 1-7; Page last modified Feb. 20, 2004.
Brian Konesky; AutoDevSurf; http:/www.interchange.ubc.ca/konesky/newpage2.htm; pp. 1-5; Page last modified Apr. 4, 2002.
Shingo Takeguchi, Hiromasa Suzuki, Kenji Shimada, Fumihiko Kimura and Takashi Kanai; Subdivision Surface Fitting With QEM-Based Mesh Simplification and Reconstruction of Approximated B-Spline Surfaces; The University of Tokyo Department of Precision Engineering; May 2000; pp. 202-212, p. 446.
Doug Moore and Joe Warren; Approximation of Dense Scattered Date Using Algebraic Surfaces; Department of Computer Science, Rice University; 1991; pp. 681-690.

* cited by examiner

*Primary Examiner*—Paul Dinh
(74) *Attorney, Agent, or Firm*—Brinks Hofer Gilson & Lione (57) ABSTRACT

According to the invention a characteristic property of an electronic circuit component depending on at least one variable ($X_1$, $X_2$) is approximated by an approximating function. This is accomplished by dividing a total range of said least one variable into a number of sub-ranges by inserting dividing nodes (4), and approximating characterization data points (2) in each of the sub-ranges by an elementary function, wherein the elementary functions defined in the sub-ranges join together to form said approximating function defined in said total range. The approximation is accomplished such that the approximating function is continuously partial differentiable with respect to said at least one variable ($X_1$, $X_2$) in the dividing nodes (4).

22 Claims, 6 Drawing Sheets

METHOD AND SYSTEM FOR CHARACTERIZING ELECTRONIC CIRCUITRY

This application claims the priority under U.S.C. § 119 (a)-(d) to European Patent Application 03027574.7 filed in the European Patent Office on Dec. 1, 2003 and is incorporated herein by reference.

The present invention relates to a method and a system for characterizing electronic circuitry. The present invention is in particular directed to approximating data concerning a characteristic property of an electronic circuit component by an approximating function.

In design of electronic circuitry, it is an important aspect to verify whether a particular designed circuit structure operates according to its designed function, particularly in a range of specified operating conditions. This means that a designer or a designing system in the form of a CAD (Computer Aided Design) system must have access to characteristic properties, e.g. a delay time or power consumption, of each circuit component, such as a logic cell.

Such characteristic properties typically depend on multiple variables, including for example output capacitive load, input transition rates, or temperature. To provide the designer or CAD system with the necessary information concerning the characteristic properties, cell libraries used in CAD system may also include said information, for instance as multi-dimensional tables. For a set of variables, e.g. a particular value of the capacitive load and particular value of the transition rate, such a multidimensional table provides a value of the characteristic property. Typically a table includes a plurality of such variable sets and associated values of the characteristic property.

The tables may, for example, be based on measured values of the characteristic property or simulations.

However, since complex circuit structures contain large numbers of different circuit components or cells and the characteristic properties of the cells depend on multiple variables, a large memory is required to store the tables. The memory problem increases with dimensionality of the tables, i.e. the number of variables.

To circumvent the need for large memories for storage of the tables, approximating functions have been employed to represent the characteristic properties of the cells. For example, the description language DCL (Delay Calculation Language, IEEE) allows arbitrary functions to be used for constructing a function approximating a characteristic cell property as a function of one or more variables. This approach can efficiently reduce the memory requirements, but as the process of finding such approximating functions based on arbitrary functions is time consuming and can hardly be automated, there is a need for an efficient method to create approximating functions.

In view of the above problem, U.S. Pat. No. 6,272,664 B1 discloses a method for translating a look-up table delay model into a memory efficient model, in which the characteristic property, i.e. the delay time, is modeled by a polynomial in the entire range of variables. The coefficients of the polynomial are determined by applying a least mean square fitting procedure on the table data. The order of the polynomial is adjusted to achieve a required accuracy. In order to avoid over-fitting, i.e. by a large order polynomial which may have oscillatory characteristics between data points, it is necessary to calculate a chi-square value, which is a sensitive measure for the quality of the approximating function.

Such a fitting procedure requires a substantial amount of calculation time and may still in some cases fail to produce a suitable approximation to the table data.

Therefore, it is an object of the present invention to provide a method and a system for characterizing electronic circuitry which solves the above-mentioned problem and, in particular, on the one hand provides an improved approximation of characterization data points and on the other hand avoids undesired characteristics, such as oscillatory behavior, of the approximating function between data points.

The method of the present invention is directed to approximating characterization data concerning a characteristic property of an electronic circuit component, e.g. a logic cell, by an approximating function, wherein the characteristic property depends on at least one variable. The characterization data may be in the form of a table comprising a plurality of data points. According to the present invention, a total range of the at least one variable, in which total range the approximating function is defined to approximate the characterization data, is divided into a number of sub-ranges by inserting dividing nodes, such that, at the dividing nodes, the sub-ranges join together to reform said total range. Then, in each of the sub-ranges, the characterization data is approximated by an elementary function. The approximating function, which is defined in the total range, is formed by combining or joining together the elementary functions at the dividing nodes. The elementary functions are defined to approximate the characterization data in the sub-ranges, such that the resulting approximating function is continuously partial differentiable with respect to said at least one variable in said dividing nodes.

This procedure yields a smooth curve or multi-dimensional surface approximating the characterization data points. In particular, it ensures that the approximating function has no abrupt changes of the slope at the dividing nodes. Moreover, this procedure allows for a highly accurate approximation of the characterization data without causing the approximating function to oscillate between data points. Hence, undesired characteristics of the approximating function are effectively suppressed.

Preferably, if the characterization data depends on one variable, the approximation is accomplished under the further condition that in the dividing nodes the approximating function is two times continuously differentiable with respect to said one variable. This reduces the overall curvature of the approximating function and avoids further undesired characteristics of the approximating function at the dividing nodes.

Preferably, if the characterization data depends on at least two variables, the approximation is accomplished under the further condition that in the dividing nodes the partial derivative of the approximating function with respect to one of said at least two variables is continuously partial differentiable with respect to each of the remaining variables. This means that in the dividing nodes higher order mixed partial derivatives exist and are continuous. This ensures smoothness of the multi-dimensional surface defined by the approximating function.

Preferably, the elementary functions used for approximating the characterization data in the sub-ranges are chosen to be as simple as possible. Appropriate classes of functions suitable to be used in the method according to the invention are for example low order polynomials. Preferably, the order of the polynomials used as elementary functions is three or less. In this case, the approximating function has the characteristics of a so called cubic approximating spline function. However, depending on the nature of the characterization data, also other classes of elementary functions may be appropriate.

The selection of simple elementary functions, e.g. third order polynomials, causes the resulting approximating function to show less complex characteristics. In particular, it helps to ensure that the resulting approximating function does not display any characteristics which are not included in the characterization data. Further, the use of simple functions may reduce the calculation effort in the approximation process and in applying the resulting approximating function to calculate the corresponding characteristic property when designing a circuit structure.

The approximation process of the elementary functions to the characterization data in the sub-ranges may be achieved by a least mean square procedure. Such procedures are generally well known and may be suitably adapted to the present approximation process. In particular, for the approximation process weights may be assigned to the data points. The weights allow for an improved approximation of the characterization data in predetermined regions.

Each characterization data point may correspond to a dividing node. In particular, the dividing nodes may be formed at positions of the characterization data points. Advantageously, the dividing nodes and/or the characterization data points are arranged in a uniform grid, i.e. the ranges of the variables the characteristic property depends on are divided into evenly distributed sub-ranges by the dividing nodes. This significantly simplifies calculations for approximating the characterization data by the elementary functions.

Preferably, the division of the total range into the sub-ranges is dynamically adapted. This means, that characteristics of the approximating function are evaluated or monitored during the approximation process and, if necessary, the division of the total range into sub-ranges is changed. This may, for example, be based on an error value which characterizes the overall deviation of the approximating function from the characterization data points. Such an error value is preferably extracted from the least mean square procedure, in which case additional calculations are kept at a minimum. Of course, it is also possible to calculate the error value separately, for example based on a chi square test, which may provide a more sensitive probe for the deviation of the approximating function from the characterization data.

Preferably, also the absolute and relative deviation of the approximating function from the data points is used as an error value. By this means, it can be avoided that relatively large deviations occur at single characterization data points, and for small absolute values of the characteristic property relatively large relative deviations can be accepted because of the small corresponding absolute deviations.

The dynamic adaptation of the division of the total range into sub-ranges is preferably accomplished by elementary operations. In particular, these may comprise inserting additional dividing nodes or removing dividing nodes. A combination of these elementary operations may be used to change the position of the dividing nodes.

The above-described dynamic adaptation of the division of the total range into the sub-ranges allows for optimizing memory requirements for storing the resulting approximating function. In particular, it allows for keeping the number of dividing nodes at a minimum necessary to achieve an approximation with a predetermined accuracy. Hence, the number of parameters needed for a unique representation of the approximating function is minimized.

An initial division of the total range into sub-ranges may be based on dividing the total range into a predetermined number of sub-ranges, for example, of equal size. In particular, the procedure according to the invention may start with only one sub-range which is then dynamically divided by inserting dividing nodes. The advantage of this initial value is that a simple approximating function may be found after only few calculations.

Another possibility is to start with a maximum number of sub-ranges. In this case, dividing nodes are removed until a sufficiently simple approximating function is found, which at the same time approximates the characterization data with a predetermined accuracy. This procedure has the advantage that dividing nodes can be removed selectively to simplify the approximating function. By this means, after only few calculations a division of the total range can be achieved, which is close to an optimum division.

Further, it is possible to start with a minimally defined sub-range, which includes a number of data points necessary to find a unique solution for the elementary function in this sub-range. Then the sub-range is extended as to include further data points and the parameters of the elementary function are adjusted. If the minimal error value, which can be achieved by adjusting the elementary function, exceeds a predetermined value additional dividing nodes are inserted to define a new minimal sub-range adjacent to the previous one. The procedure is repeated until all data points are included in the sub-ranges.

According to a preferred embodiment of the invention, the above-described dynamic adaptation of the division of the total range into sub-ranges further includes monitoring whether the approximating function satisfies predetermined monotony conditions. Such a monotony condition may specify that, in a predetermined range of a variable, the approximating function is either an increasing function or a decreasing function of said variable. If the monotony condition is not satisfied, the approximating function is modified. This modification may in particular be achieved by addition or removal of dividing nodes and newly calculating the approximating function, until the monotony condition is satisfied. The modification step may also add supporting points to the characterization data and/or adjust the weights assigned to characterization data points or existing supporting points. The supporting points are determined by suitably interpolating characterization data points. Hence, the monitoring of monotony conditions further improves the suppression of undesired characteristics of the approximating function.

According to the present invention, a system for characterizing electronic circuitry comprises input means for providing input of characterization data, processing means adapted for dividing a total range of a variable into sub-ranges by inserting dividing nodes and approximating the characterization data in each of the sub-ranges by an elementary function, wherein the elementary functions defined in the sub-ranges join together to form said approximating function defined in said total range. The elementary functions are adjusted such that in the dividing nodes the resulting approximating function is continuously partial differentiable with respect to said at least one variable. Further, the system comprises output means for providing output of said approximating function.

The system of the invention may be implemented in the form of a computer system, which is used in connection with a computer software product, said computer software product being adapted to cause the computer system to perform the above-described method or procedure.

The present invention has the advantage that characterization data of electronic circuit components are represented in a memory efficient way. The effort in the form of human interaction to approximate the characterization data is kept at a minimum. Further, the invention allows for finding approximating functions even in case of ill behaved circuit components, which may have very complex dependencies of a characteristic property on one or more variables. At the same time, undesired characteristic of the approximating function are effectively suppressed.

In the following, the invention is described in detail by discussing preferred embodiments with reference to the accompanying drawings.

Figure 1:
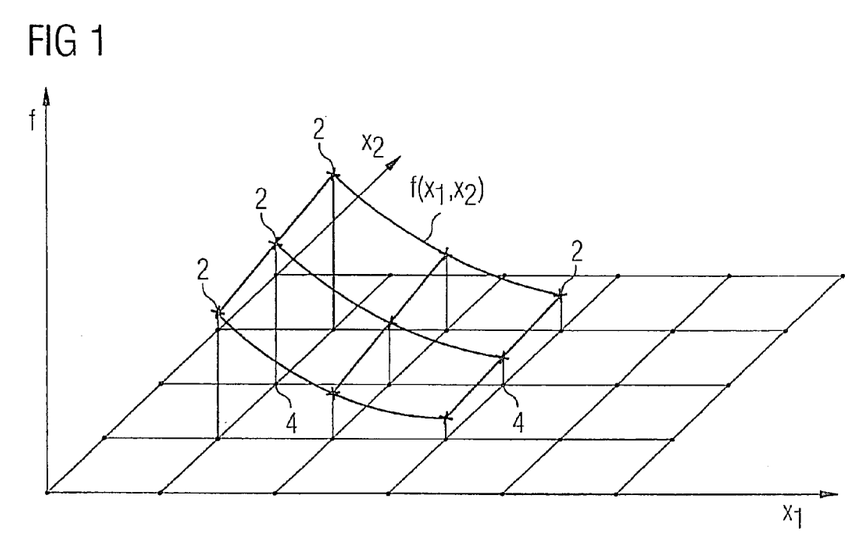
FIG. 1 schematically shows a function depending on two variables.

FIG. 1 schematically shows a function $f(X_1, X_2)$ depending on two variables $X_1, X_2$. The function $f(X_1, X_2)$ may, for example, represent a characteristic property of an electronic circuit component, such as a delay time depending on a capacitive output load and an input transition rate. In general, equations representing such functions are not known in detail and are instead represented by the characterization data points or approximating functions.

The function $f(X_1, X_2)$ defines characterization data points, exemplarily denoted by 2. The function is defined in a total range of variables $X_1, X_2$ which is divided into sub-ranges by dividing nodes, exemplarily denoted by 4. The dividing nodes 4 divide each of the total ranges of variables $X_1, X_2$ into sub-ranges which are evenly distributed.

Figure 2:
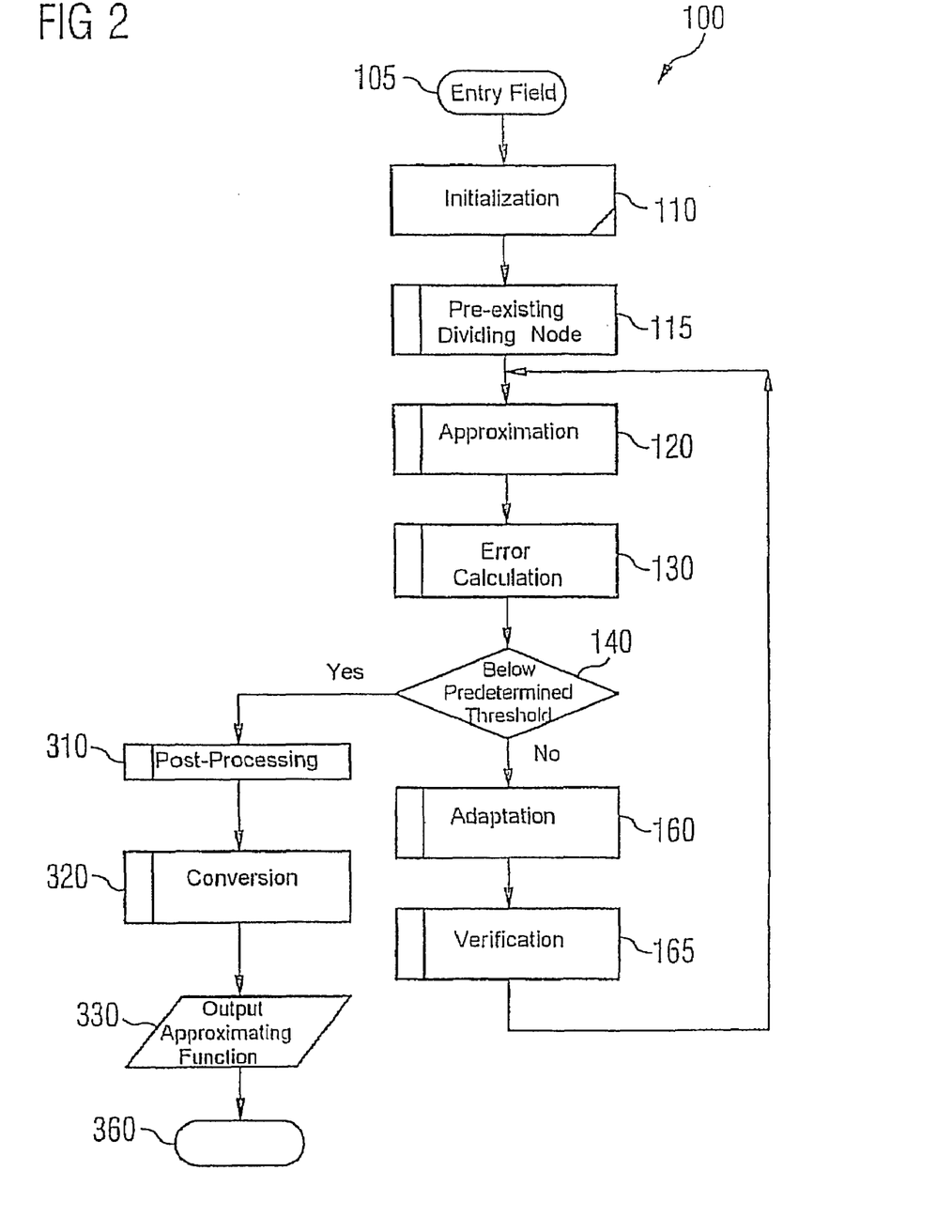
FIG. 2 is a flow chart visualizing a procedure for characterizing electronic circuitry according to an embodiment of the present invention.

FIG. 2 shows a flow chart illustrating a procedure 100 for characterizing electronic circuitry according to an embodiment of the present invention. Based on characterization data of electronic circuit components, such as a logic cell, the procedure 100 determines an approximating function. The characterization data may in particular be data for characterizing the cell delay time, such as illustrated in FIG. 1. The procedure 100 may be implemented as a computer program, which is stored in memory of a computer system and is called by a routine call or sub-routine call.

For the procedure 100 characterization data points 2 are used which have values of the variables $X_1, X_2$ that are arranged to form a uniform grid in the $X_1$-$X_2$-plane.

In the procedure 100, the variables $X_1, X_2$ are treated separately, i.e. all but one of the variables $X_1, X_2$ are held at fixed values, while the characterization data points 2 are approximated along a line defined by said fixed values as a function of said one variable. The procedure is repeated for each of the variables.

The procedure 100 is entered from an entry field 105. In an initialization step 110 the initial division of the total range, in which the characteristic property of the cell is to be described, is effected. In particular, the total range includes all characterization data points 2 of the characterization data. The initial division has only one sub-range, i.e. this initial sub-range is essentially identical to the total range.

In a next step 115, dividing nodes 4 are determined based on already existing dividing nodes. This means, if for a first fixed value of one variable $X_1$ dividing nodes have already been determined in the range of the other variable $X_2$, corresponding dividing nodes are inserted for a second fixed value of the variable $X_1$. In case there are no already existing dividing nodes, step 115 can be omitted.

In an approximation step 120, for each sub-range an elementary function is determined which approximates the characterization data points 2 in this sub-range. The elementary function is chosen to be a third order polynomial, and during the approximation process the coefficients of this polynomial are adjusted by means of a least mean square procedure. The least mean square procedure uses weights assigned to the characterization data points 2.

The parameters of the elementary function, i.e. the coefficients of the polynomial, and preferably also the weights are adjusted under the condition that in the dividing nodes between adjacent sub-ranges the approximating function, which is formed by joining together all elementary functions determined for each sub-range, is continuously partial differentiable with respect to said one variable and that the partial derivative of the approximating function with respect to said one variable is continuously partial differentiable with respect to each of the remaining variables. In case of the two-dimensional function shown in FIG. 1, the latter condition corresponds to the condition that in the dividing nodes (4) between adjacent sub-ranges the second order mixed partial derivative $\partial^2/\partial X_1 \, \partial X_2$ of the approximating function exists and is continuous.

Appropriate boundary conditions may be set at the outer sub-ranges. This approximation step, in connection with the third order polynomials used as elementary functions, corresponds to calculating a cubic approximating spline function defined in the total range of the variable. The approximation step 120 is performed iteratively.

In an error calculation step 130, an error value is calculated. The error value may be global error value, such as a mean square error. The latter can be easily extracted from the results of the least mean square procedure of the approximation step 120. Further, a chi square value can be calculated and used as an error value.

The error calculation step 130 may also evaluate individual relative or absolute deviations of the approximating function from each of the characterization data points 2.

In a decision step 140 it is decided, whether the error value or error values are below a predetermined threshold. If this is not the case, the procedure 100 continues with adaptation step 160.

In the adaptation step 160, the division of the total range into sub-ranges is adapted by inserting additional dividing nodes 4. This may be accomplished in a way that sub-ranges are divided into new sub-ranges of equal length. However, if in the error calculation step 130 individual errors have been evaluated for the characterization data points 2, the additional dividing nodes 4 can be inserted in the particular region in which the error value has exceeded the predetermined value.

In verification step 165, the present division is verified. This is accomplished by comparison of the present division to other possible divisions, either for the total range or for the last divided sub-range. By this means, an optimum division can be achieved with less calculation steps. After the verification step 165 the procedure 100 continues with approximation step 120 to newly approximate elementary functions.

If in the decision step 140 the error value or the error values are lower than a predetermined threshold, the procedure 100 continues with post-processing step 310.

In the post-processing step 310 the representation of the approximating function is simplified in order to reduce memory requirements for storing the approximating function.

Then, in conversion step 320 the representation of the approximating function is converted into a format used in a CAD system for designing electronic circuits. This format is typically a polynomial format and the conversion is accomplished by a unique transformation, i.e. without loss of information.

The resulting approximating function is then output in output step 330. In particular, this includes storing the approximating function for a subsequent use in above-mentioned CAD systems.

The procedure 100 ends at end point 360.

Figure 3:
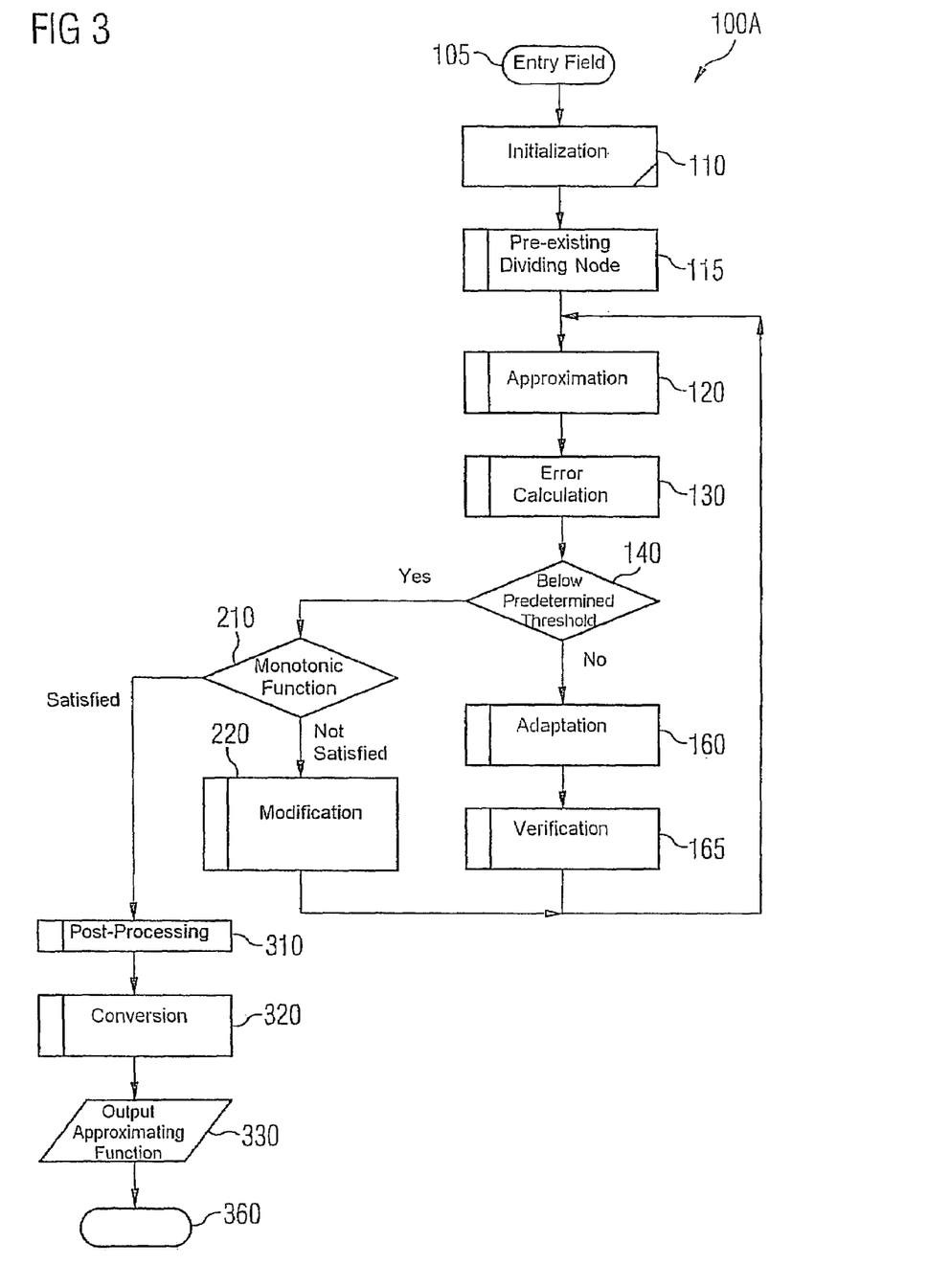
FIG. 3 is a flow chart visualizing an extended procedure for characterizing electronic circuitry according to a further embodiment of the present invention, wherein monotony conditions of the approximating function are monitored.

FIG. 3 is a flow chart illustrating and extended procedure 100A for characterizing electronic circuitry according to a further embodiment of the present invention. Steps and procedures similar to the steps explained in connection with the procedure 100 illustrated in FIG. 2 are denoted by the same reference signs and explanation thereof will be omitted.

In the procedure 100A of FIG. 3, monotony conditions of the approximating function are monitored. This means, that if in the decision step 140 the error value or the error values are lower than a predetermined threshold, the procedure 100A continues with a further decision step 210.

In the decision step 210 it is checked, whether the present approximating function satisfies predetermined monotony conditions. Such monotony conditions may be used to ensure an either increasing or decreasing behavior of the approximating function in a predefined region.

If in the further decision step 210 the present approximating function does not satisfy the predetermined monotony conditions, the procedure 100A continues with modification step 220.

In the modification step 220, auxiliary conditions for the approximating function are created by inserting weighted supporting points into the characterization data or by modifying the weights assigned to the characterization data points 2 or already existing supporting points. The additional supporting points are determined by suitably interpolating the characterization data points 2.

After the modification step 220 the procedure 100A continues with the approximation step 120 to calculate a modified approximating function.

Figure 4:
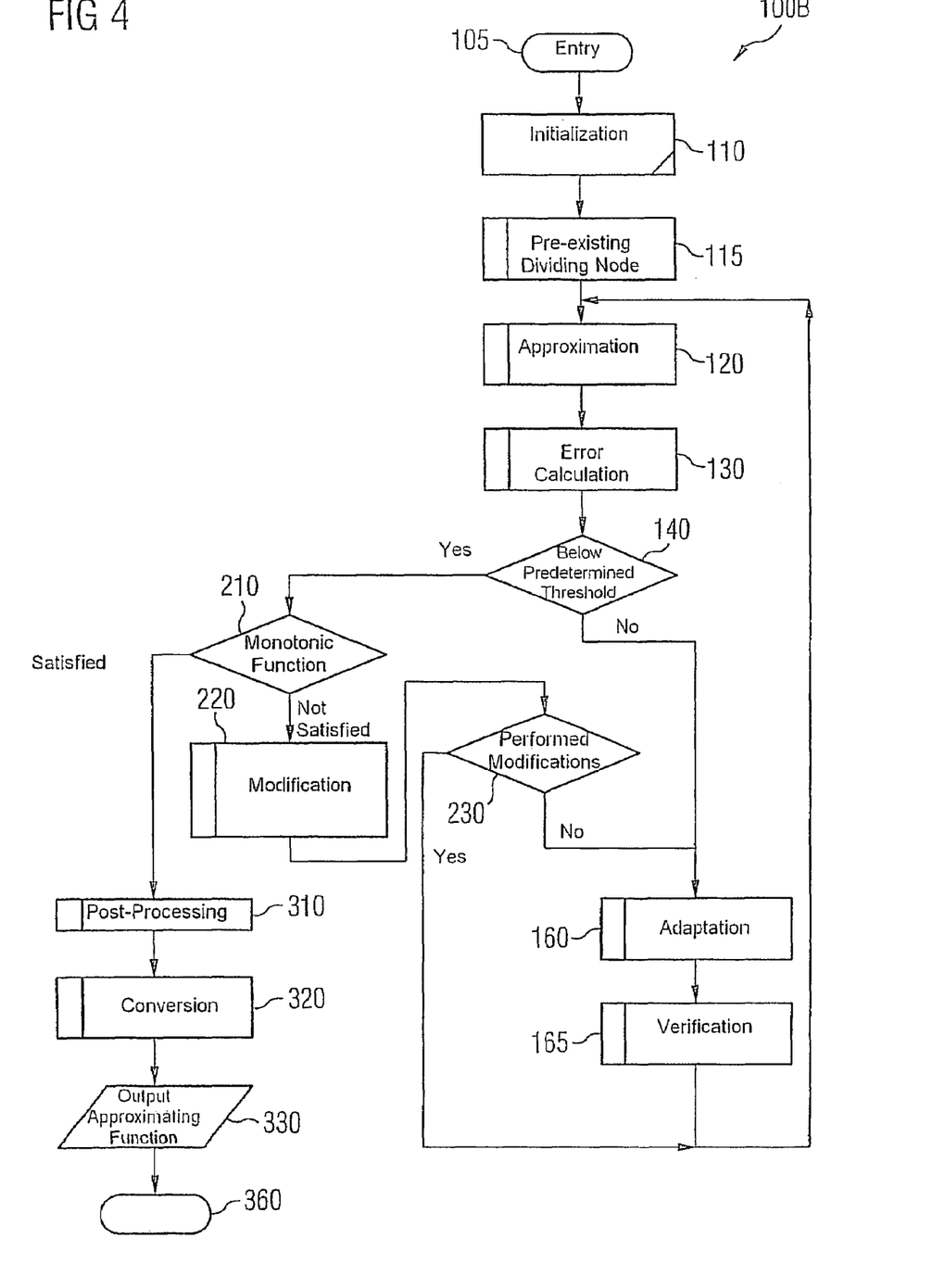
FIG. 4 is a flow chart visualizing an extended procedure for characterizing electronic circuitry according to a further embodiment of the present invention, wherein monotony conditions of the approximating function are monitored by a modified procedure.

FIG. 4 is a flow chart illustrating an extended procedure 100B for characterizing electronic circuitry according to a further embodiment of the present invention. Similar to the procedure 100A in the procedure 100B monotony conditions of the approximating function are monitored. Steps and procedures similar to the steps explained in connection with the procedures 100 and 100A illustrated in FIGS. 2 and 3 are denoted by the same reference signs and explanation thereof will be omitted.

In addition to the features of procedure 100A, the procedure 100B includes a further decision step 230 after the modification step 220. In the decision step 230 it is checked whether in modification step 220 modifications have been possible.

If in modification step 220 modifications have been possible, the procedure 100B continues with the approximation step 120 to calculate a modified approximating function.

If in modification step 220 modifications have not been possible, the procedure 100B continues with the adaptation step 160 to insert further dividing nodes 4.

The additional decision step 230 of the procedure 100B provides a further source of modification to satisfy the monotony conditions, namely adapting the division of the total range.

Figure 5:
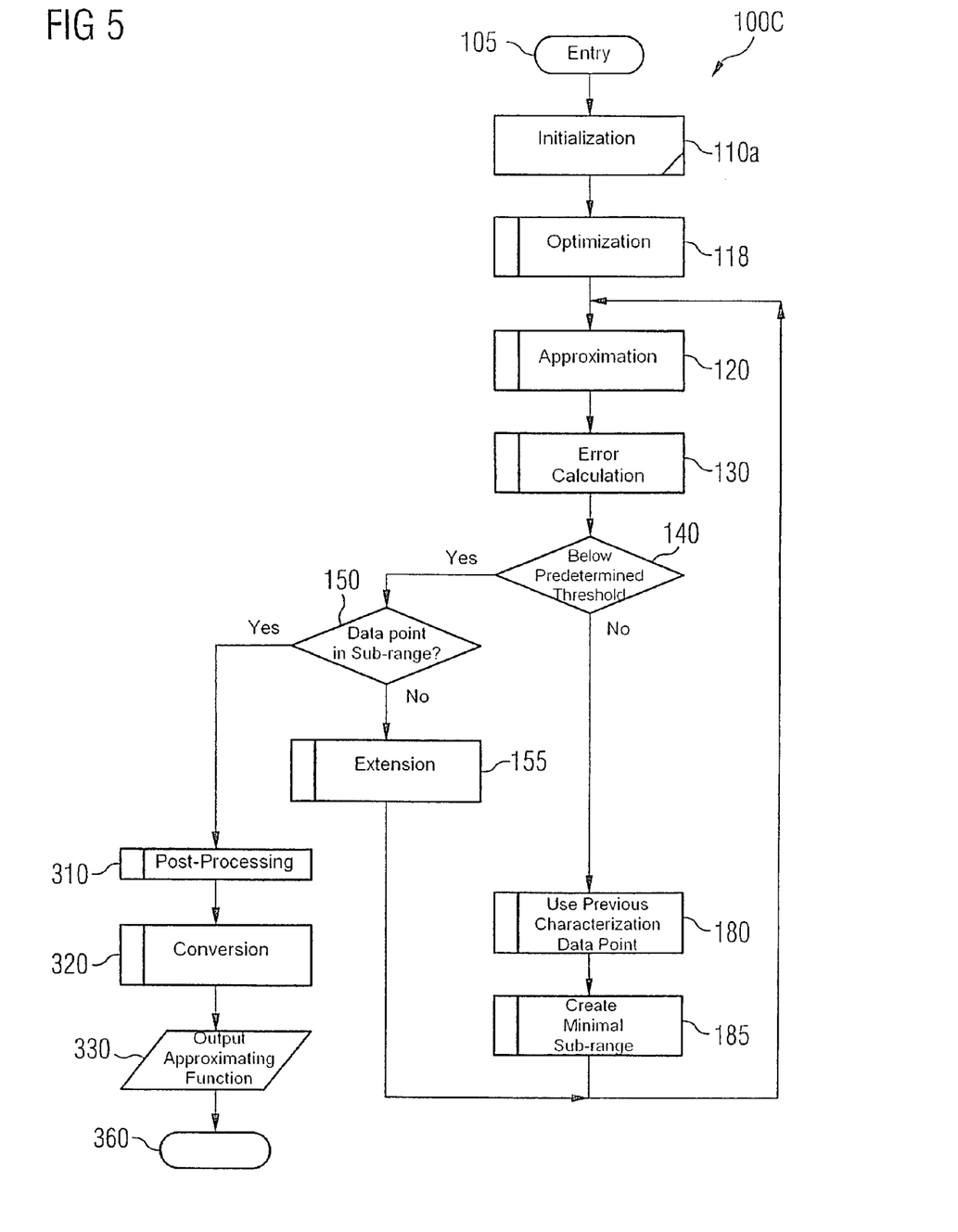
FIG. 5 is a flow chart visualizing a procedure for characterizing electronic circuitry according to a further embodiment of the present invention, wherein a different initial division of the total range into the sub-ranges is used.

FIG. 5 is a flow chart illustrating a procedure 100C for characterizing electronic circuitry according to a further embodiment of the present invention. Steps and procedures similar to the steps explained in connection with the procedure 100 FIG. 2 are denoted by the same reference signs and explanation thereof will be omitted.

In the procedure 100C a different initial division of the total range into the sub-ranges is used. In initialization step 110a a minimal sub-range is used as initial range. This minimal sub-range includes a number of data points which is necessary to find a unique solution for the elementary function in this minimal sub-range. In the minimal sub-range the elementary function can be adjusted to interpolate the characterization data points 2.

After the initialization step 110a, the procedure 100C continues with optimization step 118. If multiple sub-ranges have already been created by the procedure 100C, the optimization step 118 optimizes the division of the sub-ranges. This is accomplished by comparison of different configurations of dividing nodes at different positions and, if an improved configuration is found, changing the division to this improved configuration.

If in decision step 140 the error value is not lower than the predetermined threshold, the procedure 100C continues with step 180.

In step 180, the solution for the previous number of characterization data points 2 in the presently processed sub-range is used, and then, in step 185, a further minimal sub-range is created adjacent to the previous sub-range and divided from said previous sub-range by a dividing node 4.

After step 185 the procedure 100C returns to the optimization step 118, now processing the sub-range newly created in step 185.

If in decision step 140 the error value is lower than the predetermined threshold, the procedure 100C continues with decision step 150. Due to the features of the minimal sub-range defined in the initialization step 110a, this is always true in a first loop of the procedure 100C.

In decision step 150, it is decided whether all characterization data points are 2 included in the present sub-ranges. If this is not the case, the procedure 100C continues with extension step 155.

In extension step 155, the sub-range presently processed by the procedure 100C is extended to include a further characterization data point 2, wherein the above-mentioned conditions for the dividing nodes are maintained. Then, the procedure 100C returns to optimization step 118.

If in decision step 150 all characterization data points 2 are found to be included in the sub-ranges for which processing is finished, procedure 100C continues with post processing step 310.

Figure 6:
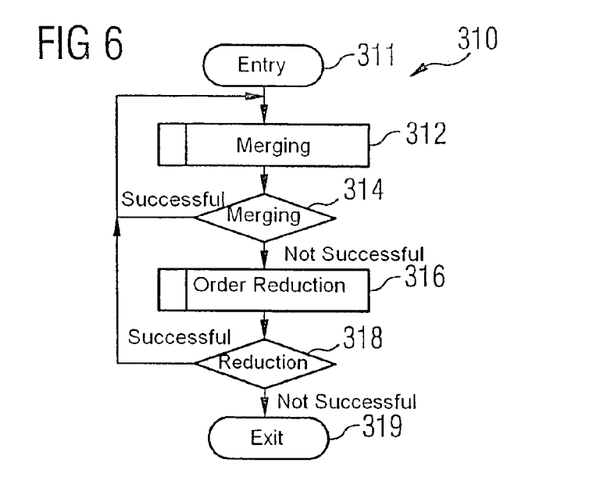
FIG. 6 is a flow chart visualizing an example for a post processing step of the procedures of FIGS. 2 to 5.

FIG. 6 is a flow chart illustrating an example for the post processing step of the procedures 100, 100A, 100B, and 100C.

The post processing step 310 is entered from an entry point 311.

Then, in merging step 312, it is checked whether or not it is possible to merge adjacent sub-ranges. This is accomplished by extending the elementary function of a sub-range to an adjacent sub-range. If in said adjacent sub-range the elementary function satisfies conditions regarding error values and curvature of the approximating function in the dividing nodes 4, the corresponding sub-ranges are merged.

Then, in decision step 314, it is checked whether a successful merging operation could be performed in merging step 312. If this is the case, the procedure of the post processing step 310 returns to the merging step 312 to perform further merging operations.

If in decision step 314 no successful merging operation is found, the procedure of the post processing step 310 continues with order reduction step 316.

In order reduction step 316, it is checked whether the order of the polynomials forming the elementary functions can be reduced. This is accomplished by setting the highest order coefficient zero and checking error values and curvature of the approximating function in the dividing nodes 4. If satisfactory agreement with predetermined conditions is achieved the order of the corresponding polynomial is reduced by omitting the highest order coefficient.

If in decision step 318 the order reduction step 316 was successful, the procedure of the post processing step 310 returns to the merging step 312, in order to perform further merging operations and order reduction operations.

If in decision step 318 no successful order reduction step is found, the procedure of the post processing step proceeds to end point 319 and returns to the main procedure.

The above described post processing step 310 and especially the merging step 312 may reduce the memory required for storage of the approximating function in a significant extent.

Figure 7:
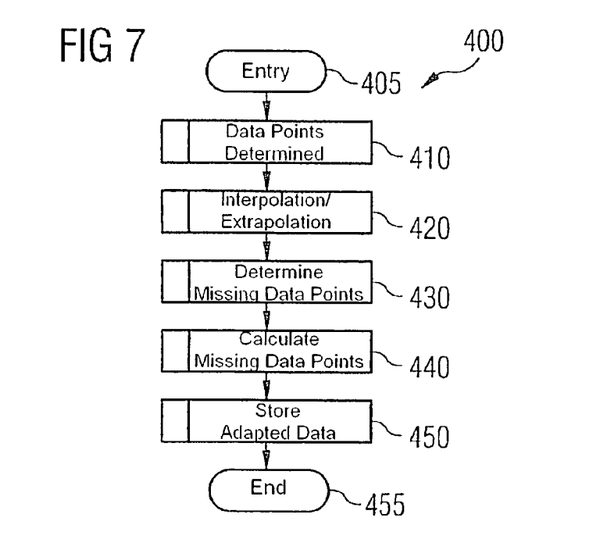
FIG. 7 is a flow chart visualizing an interpolation procedure for interpolating characterization data for adaptation to the procedures of FIGS. 2 to 5.

FIG. 7 is a flow chart visualizing an interpolation procedure 400 for interpolating characterization data points 2 to adapt the characterization data to the procedures of FIG. 2 to 5.

The procedures 100, 100A, 100B, and 100C require that for the characterization data points 2 the values of the variables are arranged to form a uniform grid in the $X_1$-$X_2$-plane. However, this is not the case for many typical sets of characterization data, in which the values of the variables are rather randomly distributed. Also, in the characterization data, data points necessary to form the uniform grid configuration can be missing.

From such characterization data, a set of characterization data points 2 suitable for the procedures 100, 100A, 100B, and 100C may be created using the interpolation procedure 400.

The interpolation procedure 400 is entered from entry point 405 and may be called before executing one of the procedures 100, 100A, 100B, and 100C. The interpolation procedure may also be called from within one of the procedures 100, 100A, 100B, and 100C, for example, if a characterization data point 2 is missing at a particular position.

In step 410, the values of the variables $X_1$, $X_2$ used for the characterization data points 2 are determined. If possible, in interpolation/extrapolation step 420, interpolations or extrapolations are created for the characterization data points 2. Then, in step 430, the data points missing for said uniform grid configuration are determined, and in calculation step 440 the values of the characteristic property described by the characterization data are calculated for said missing data points, such that a new characterization data set with data points in the uniform grid configuration is formed. Finally, in storage step 450 the adapted characterization data are stored for further processing. The interpolation procedure 400 ends at end point 455.

Figure 8:
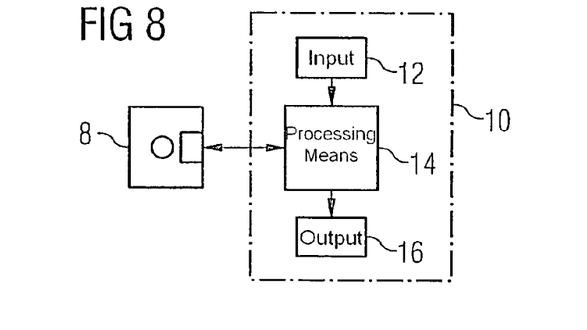
FIG. 8 schematically shows a system for characterizing electronic circuitry according to an embodiment of the present invention.

FIG. 8 schematically shows a computer system 10 for characterizing electronic circuitry according to an embodiment of the present invention. The computer system 10 comprises input means 12 for providing input of characterization data. The computer system 10 further comprises processing means 14 adapted for dividing the total range of a variable $X_1$, $X_2$ into a number of sub-ranges by inserting dividing nodes 4 and for approximating the characterization data in each of the sub-ranges by an elementary function. In addition the computer system 10 comprises output means 16 for providing output of said approximating function.

In connection with a computer software product 8 comprising a computer program, the computer system 10 performs at least one of the above-described procedures 100, 100A, 100B, and 100C.

The input means 12 preferably comprise a reading device for reading a storage medium and the output means 16 preferably comprise a writing device for writing on a storage medium. The input means 12 and the output means may also comprise interface means, such as a network interface, for respectively receiving or transmitting the corresponding data.

The input means 12 may also comprise or be connected to measuring means for measuring the characterization data.

Although the preferred embodiments have been described with reference to two-dimensional characterization data depending on two variables, the invention is not limited thereto. The invention is in especially advantageous in case of multi-dimensional characterization data depending on a plurality of variables. Further, the approximation process may also be directly applied to characterization data points with random distribution of the values of the variables, i.e. when the characterization data points are not arranged in a uniform grid configuration.

The invention claimed is:

1. A system for characterizing electronic circuitry comprising:
    a data input to receive characterization data representing a measurable property of an electronic circuit component, said measurable property depending on at least one variable value;
    a processing device to divide a total range of said at least one variable value into a number of sub-ranges by inserting dividing nodes into the sub-range;
    a processing device to approximate the characterization data in each of the sub-ranges by a respective elementary function in the sub-range;
    a processing device to determine an approximating function defined in said total range by joining together the elementary functions at the dividing nodes in such a way that the approximating function is continuously partial differentiable with respect to the at least one variable value in the dividing nodes; and a data output to output data related to the approximating function.

2. A method for characterizing electronic circuitry comprising the steps of:
obtaining characterization data representing a measurable property of an electronic circuit component, said measurable property depending on at least one variable value;
dividing a total range of said at least one variable value into sub-ranges by inserting dividing nodes into the total range;
approximating the characterization data in each of the sub-ranges by a respective elementary function defined in the sub-range;
determining an approximating function defined in said total range by joining together the elementary functions at the dividing nodes in such a way that the approximating function is continuously partial differentiable with respect to the at least one variable value in the dividing nodes; and
producing, at a data output, data related to the approximating function.

3. The method of claim 2, wherein the characteristic property depends on one variable value.

4. The method of claim 3, further comprising the step of approximating the characterization data in the dividing nodes where the approximating function is two times continuously differentiable with respect to said one variable value.

5. The method of claim 2, wherein the characteristic property depends on at least two variable values.

6. The method of claim 5, further comprising the step of approximating the characterization data in the dividing nodes where a partial derivative of the approximating function with respect to one of the at least two variable values is continuously differentiable with respect to each of the remaining variable values.

7. The method of claim 2, wherein the elementary functions depend on parameters that are determined in the approximating step by a least mean square procedure.

8. The method of claim 7, wherein the elementary functions comprise third order polynomials and said parameters are coefficients of the polynomials.

9. The method of claim 2, wherein a weight is assigned to a data point in the characterization data.

10. The method of claim 2, further comprising the steps of:
monitoring a monotonic condition of the approximating function;
assigning a weight to a data point in the characterization data; and
adjusting the weight dependent upon a result of the monitoring step.

11. The method of claim 2, further comprising the steps of:
monitoring a monotonic condition for the approximating function; and
inserting supporting points to the characterization data dependent upon a result of the monitoring step.

12. The method of claim 2, further comprising the steps of:
monitoring a monotonic condition for the approximating function; and
dynamically adapting the dividing of the total range into the sub-ranges dependent upon a result of the monitoring step.

13. The method of claim 12, wherein dynamically adapting includes inserting additional dividing nodes into the total range.

14. The method of claim 12, wherein dynamically adapting includes removing dividing nodes from the total range.

15. The method of claim 2, further comprising dynamically adapting the division of the total range into the sub-ranges dependent upon an error value that measures a deviation of the approximating function from the characterization data.

16. The method of claim 15, wherein dynamically adapting includes inserting additional dividing nodes into the total range.

17. The method of claim 15, wherein dynamically adapting includes removing dividing nodes from the total range.

18. The method of claim 2, wherein an initial number of sub-ranges is one.

19. The method of claim 2, wherein an initial sub-range is chosen to contain a minimal number of data points of the characterization data.

20. The method of claim 2, wherein the dividing nodes correspond to positions of data points in the characterization data.

21. The method of claim 2, further comprising a post processing step after the approximating step, wherein sub-ranges are merged and/or elementary functions are simplified.

22. A computer program product comprising a computer readable storage medium with a program code which, when used in connection with a computer system, controls the computer system to perform a method comprising the following steps:
obtaining characterization data representing a measurable property of an electronic circuit component, said measurable property depending on at least one variable value;
dividing a total range of said at least one variable value into sub-ranges by inserting dividing nodes into the total range;
approximating the characterization data in each of the sub-ranges by a respective elementary function defined in the sub-range;
determining an approximating function defined in said total range by joining together the elementary functions at the dividing nodes in such a way that the approximating function is continuously partial differentiable with respect to the at least one variable value in the dividing nodes; and
producing, at a data output, data related to the approximating function.

* * * * *